(12) United States Patent
Mate

(10) Patent No.: US 9,154,100 B2
(45) Date of Patent: Oct. 6, 2015

(54) EQUALIZER

(71) Applicant: Red Lion 49 Limited, Begbroke, Oxford (GB)

(72) Inventor: David Joseph Mate, Long Compton (GB)

(73) Assignee: Red Lion 49 Limited, Begbroke, Oxford (GB)

( * ) Notice: Subject to any disclaimer, the term of this patent is extended or adjusted under 35 U.S.C. 154(b) by 143 days.

(21) Appl. No.: 14/090,825

(22) Filed: Nov. 26, 2013

(65) Prior Publication Data

US 2014/0153745 A1 Jun. 5, 2014

(30) Foreign Application Priority Data

Nov. 30, 2012 (GB) .................................. 1221560.4

(51) Int. Cl.
*H03G 5/00* (2006.01)
*H03G 5/16* (2006.01)
*H03G 5/02* (2006.01)

(52) U.S. Cl.
CPC ............... *H03G 5/165* (2013.01); *H03G 5/005* (2013.01); *H03G 5/025* (2013.01)

(58) Field of Classification Search
CPC ....... H03G 5/165; H03G 5/005; H03G 5/025; H03G 9/025

USPC ................... 381/103, 98, 107, 106, 104, 102
See application file for complete search history.

(56) References Cited

U.S. PATENT DOCUMENTS

| 3,792,367 A | 2/1974 | Fleischer et al. |
| 5,572,163 A | 11/1996 | Kimura et al. |
| 2008/0008335 A1* | 1/2008 | Mate ............................ 381/104 |

FOREIGN PATENT DOCUMENTS

| EP | 0110555 A3 | 6/1984 |
| SU | 1322420 A1 | 7/1987 |

* cited by examiner

*Primary Examiner* — Paul S Kim
(74) *Attorney, Agent, or Firm* — Richard M. Goldberg

(57) ABSTRACT

An equalizer (402) is shown, having a state variable filter in which a first MDAC (502) is coupled to a first integrator (503) and a second MDAC (504) is coupled to a second integrator (505) to allow control of the corner frequency of the state variable filter. The MDACs are each configured to provide variable attenuation in a plurality of discrete steps. A digital attenuation controller is coupled to and adjusts the attenuation of the MDACs independently, and effects a one-step increase in the corner frequency of the state variable filter by first determining the attenuation levels of the MDACs, and then controlling the attenuation levels of the MDACs in accordance with their existing attenuation levels.

8 Claims, 8 Drawing Sheets

EQUALIZER

CROSS REFERENCE TO RELATED APPLICATIONS

This application claims priority from United Kingdom Patent Application No. 12 21 560.4, filed Nov. 30, 2012, the whole contents of which are incorporated herein by reference in their entirety.

BACKGROUND OF THE INVENTION

1. Field of the Invention

The present invention relates to the equalization of audio signals, and in particular to higher resolution control of an equalizer circuit employing multiplying digital-to-analog converters to effect parameter control.

2. Description of the Related Art

Equalizers are commonly used in sound recording environments to alter aspects of the tonality of a recording, and often find themselves incorporated in traditional mixing consoles as part of a channel strip. For instance, sound produced by some instruments may need to be made more prominent, such as that produced by a quiet wind instrument, whilst some may need to be reduced in level, such as that produced by a bass drum. In addition, problems caused by the acoustics of a recording studio, such as an uneven frequency response can be mitigated by using an equalizer.

Equalizers come in a number of flavours. Simple shelving filters boost or cut the level of sound below or above a certain frequency, often called a corner or rollover frequency. Graphic equalizers split an audio signal into a plurality of discrete frequency bands, with gain or attenuation being applied to each individual band. More sophisticated control can be had by employing a parametric equalizer, which allows control of amplitude (gain or attenuation), corner frequency (also known as centre or rollover frequency) and quality factor (Q-factor, or bandwidth) of an audio band. Thus, boost or cut can be applied by varying the amplitude of the band, the frequency it is applied at can be changed by varying the corner frequency, and the frequency range over which equalization is applied can be varied by changing the Q-factor.

Digital control of such equalizers is particularly desirable in recording environments that combine traditional mixing consoles with digital audio workstations (DAWs). A particular parameter can be changed on a DAW, and a corresponding change can be made to that parameter in the equalizer in the mixing console. In addition, adjustment devices on the mixing console itself can be of lower power design, reducing the effects of noise in the system. Problems still exist, however, in enabling higher resolution control of parameters in the equalizer in such digitally-controlled environments, so as to enable fine-tuning at a level offered by analog counterparts.

BRIEF SUMMARY OF THE INVENTION

According to a first aspect of the present invention, there is provided an equalizer for applying equalization to an input audio signal, said equalizer including: a state variable filter having a first integrator and a second integrator, and having a variable corner frequency that is controlled by means of a first MDAC coupled to said first integrator and a second MDAC coupled to said second integrator, wherein said first MDAC and said second MDAC are each configured to provide variable attenuation in a plurality of discrete steps; a digital attenuation controller coupled to and configured to adjust the attenuation of said first MDAC and said second MDAC independently, and wherein, to effect a one-step increase in the corner frequency of the state variable filter, said digital attenuation controller is configured to determine the attenuation levels of said first MDAC and said second MDAC, and: in response to determining that the attenuation of said first MDAC is equal to the attenuation of said second MDAC, increase the attenuation of said first MDAC by one step and leaving the attenuation of said second MDAC unchanged, in response to determining that the attenuation of said first MDAC is one step higher than the attenuation of said second MDAC, decrease the attenuation of said first MDAC by one step and increasing the attenuation of said second MDAC by one step, in response to determining that the attenuation of said second MDAC is one step higher than the attenuation of said first MDAC, increase the attenuation of said first MDAC by one step and leaving the attenuation of said second MDAC unchanged.

According to a second aspect of the present invention, there is provided a mixing console having a channel strip for modifying an input audio signal, said channel strip including an equalizer for applying equalization to an input audio signal, said equalizer including: a state variable filter having a first integrator and a second integrator, and having a variable corner frequency that is controlled by means of a first MDAC coupled to said first integrator and a second MDAC coupled to said second integrator, wherein said first MDAC and said second MDAC are each configured to provide variable attenuation in a plurality of discrete steps; a digital attenuation controller coupled to and configured to adjust the attenuation of said first MDAC and said second MDAC independently, and wherein, to effect a one-step increase in the corner frequency of the state variable filter, said digital attenuation controller is configured to determine the attenuation levels of said first MDAC and said second MDAC, and: in response to determining that the attenuation of said first MDAC is equal to the attenuation of said second MDAC, increase the attenuation of said first MDAC by one step and leaving the attenuation of said second MDAC unchanged, in response to determining that the attenuation of said first MDAC is one step higher than the attenuation of said second MDAC, decrease the attenuation of said first MDAC by one step and increasing the attenuation of said second MDAC by one step, in response to determining that the attenuation of said second MDAC is one step higher than the attenuation of said first MDAC, increase the attenuation of said first MDAC by one step and leaving the attenuation of said second MDAC unchanged.

According to a third aspect of the present invention, there is provided, in an equalizer including a state variable filter having a first integrator and a second integrator, thus providing said equalizer with a corner frequency variable over a plurality of discrete steps, which is controlled by means of a first MDAC coupled to said first integrator and a second MDAC coupled to said second integrator, and wherein said first MDAC and said second MDAC are each configured to provide variable attenuation levels in a plurality of discrete steps, a method of adjusting the corner frequency of said equalizer, which method comprises steps of: receiving an instruction to increment the corner frequency of the state variable filter by one step; identifying the current corner frequency of the state variable filter, by determining the attenuation levels of said first MDAC and said second MDAC; and in response to determining that the attenuation of said first MDAC is equal to the attenuation of said second MDAC, increasing the attenuation of said first MDAC by one step and leaving the attenuation of said second MDAC unchanged, in response to determining that the attenuation of said first MDAC is one step higher than the attenuation of said second MDAC, decreasing the attenuation of said first MDAC by one step and increasing the attenuation of said second MDAC by one step, in response to determining that the attenuation of said second MDAC is one step higher than the attenuation of said first MDAC, increasing the attenuation of said first MDAC by one step and leaving the attenuation of said second MDAC unchanged.

DETAILED DESCRIPTION OF EXAMPLE EMBODIMENTS

The following embodiments are described in the context of providing equalization to audio signals, such as in a mixing console. However, it will be appreciated by those skilled in the art that the principles employed by the present invention have applicability in other situations, such as providing equalization in telecommunications systems, for example.

FIG. 1

Figure 1:
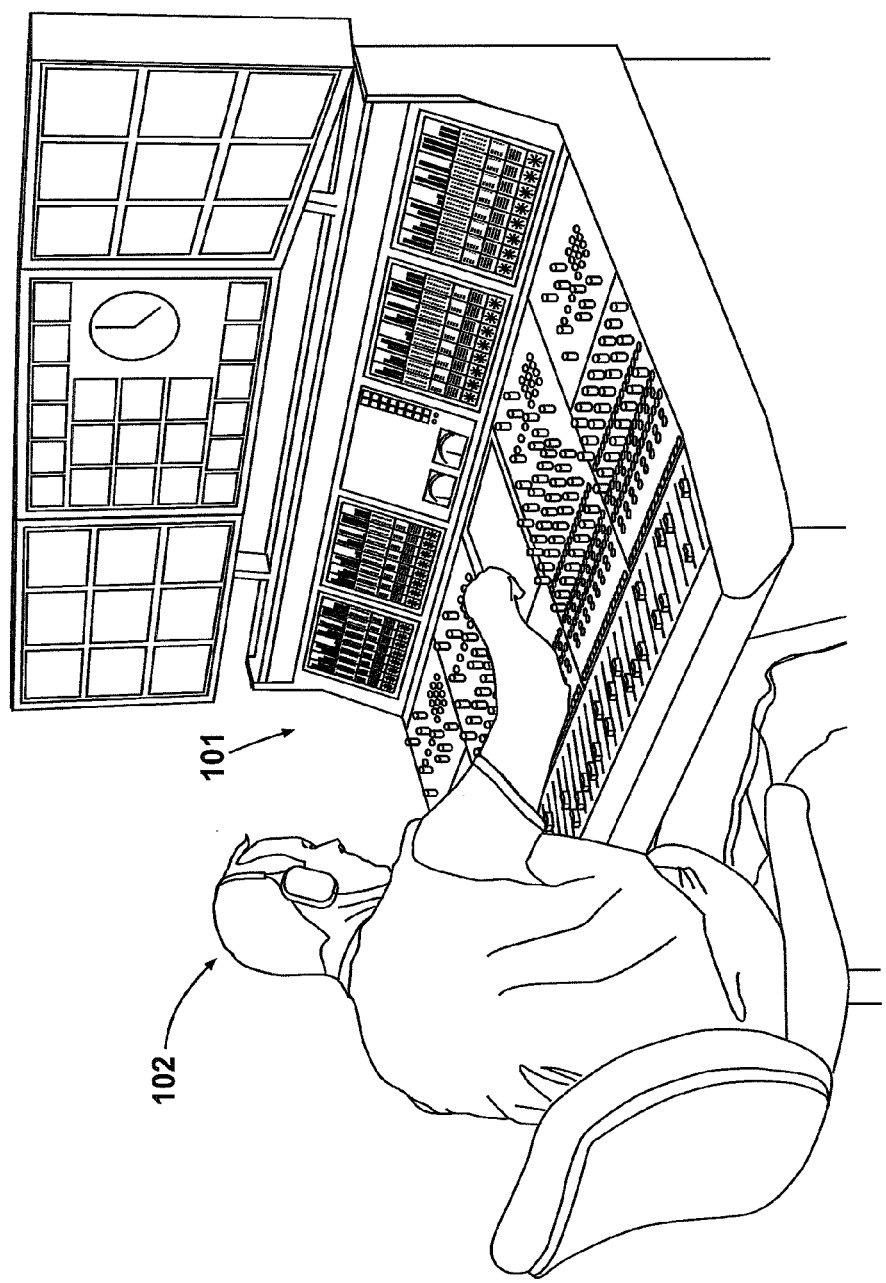
FIG. 1 shows an example of an environment in which the present invention can be used.

An example of an environment in which the present invention can be used is shown in FIG. 1. A mixing console 101 is, in this environment, being employed to mix numerous channels of audio from many disparate signal sources into one output in a live broadcast system. An operator 102 is responsible for controlling the relative contribution of each audio source into the final mix prior to it being combined with a video signal for eventual broadcast. Of course, it will be appreciated by those skilled in the art that the use of mixing consoles like mixing console 101 is not exclusive to broadcast environments, with them also being employed in recording studios, public address systems and film post-production environments.

FIG. 2

Figure 2:
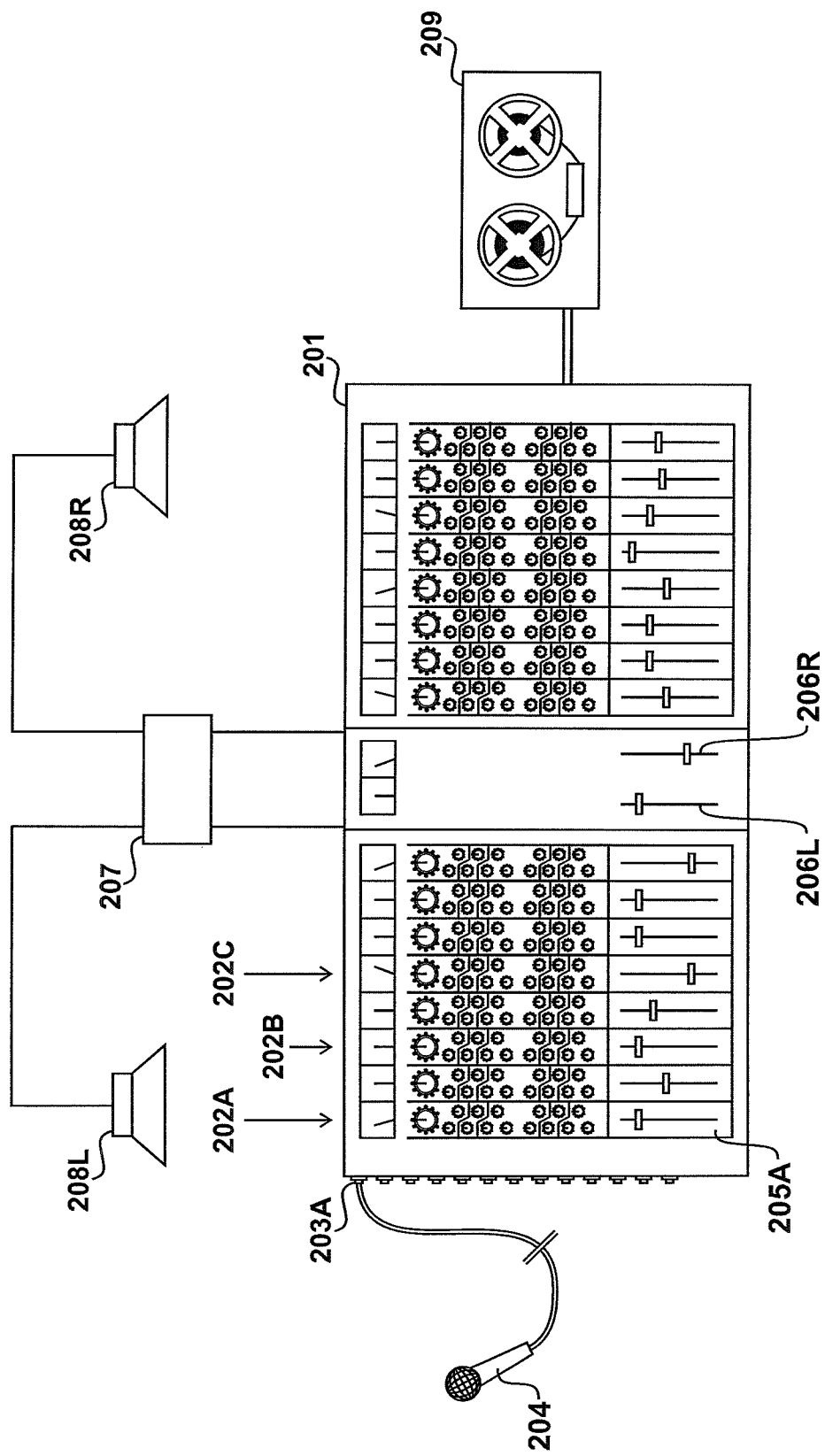
FIG. 2 shows a schematic representation of an exemplary mixing environment, including a mixing console.

A schematic representation of an exemplary mixing environment is illustrated in FIG. 2. A mixing console 201 embodying an aspect of the present invention is shown in simplified form in the Figure, and comprises a number of channel strips such as channel strips 202A, 202B and 202C for processing channels of audio. Each of these channel strips, for instance channel strip 202A, corresponds to one particular input, such as input 203A which receives an input signal from a microphone 204. Each channel strip includes controls to effect various modifications of the input signal, such as the gain applied by a pre-amplifier, the degree of compression to be applied, and the degree of frequency-based equalization to be applied, possibly including high- and low-frequency shelving filters, and low-to-mid frequency and high-to-mid frequency parametric equalizer filters.

Faders, such as fader 205A, are also present to control the relative contribution of the channel to the final mix. In this example, master faders 206L and 206R are also present which control the contribution of each of two stereo channels to the final mix. A power amplifier 207 is also provided, to allow the mix to be monitored by an operator by means of two loudspeakers, 208L and 208R. In addition, in this example, a recording of the final mix is made by a recording device 209.

FIG. 3

Figure 3:
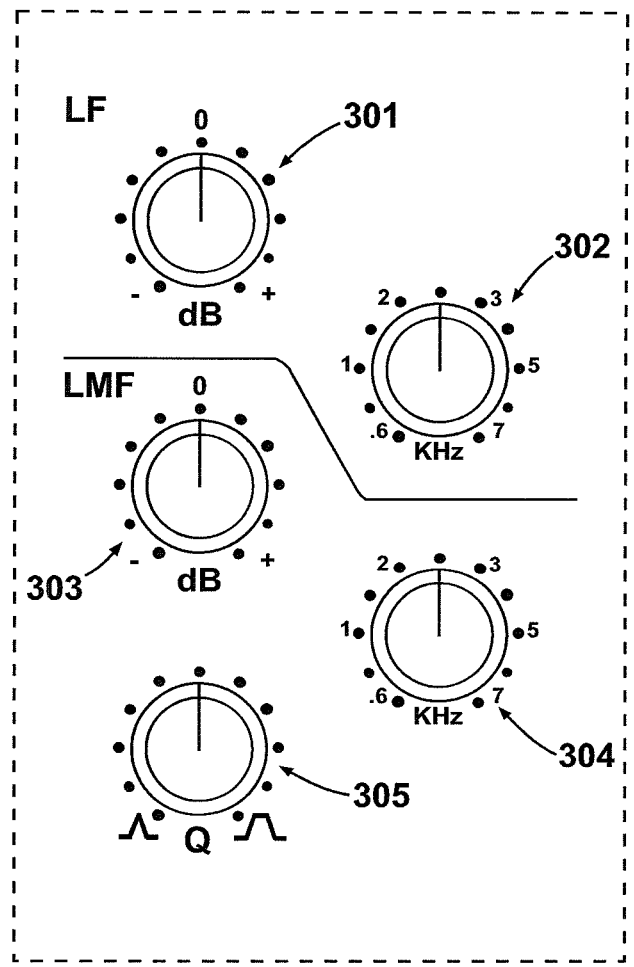
FIG. 3 shows an example of adjustment devices present on the mixing console.

A closer view of a set of adjustment devices present in channel strips on mixing console 201, such as channel strip 202A, is shown in FIG. 3.

A first couple of adjustment devices are present, which allow adjustment of the properties of a low-frequency shelving filter equalizer in channel strip 202A, which equalizer has characteristics well known to those skilled in the art.

An amplitude control 301 allows adjustment of the amplitude of a particular range of frequencies in the sound being processed by channel strip 202A. The corner frequency of the equalizer can be adjusted by means of a frequency control 302. As can be seen in the Figure, amplitude control 301 allows both boost and cut to be applied to the frequency selected by frequency control 302. Thus, frequencies lower than the frequency selected by frequency control 302 can either have gain applied to them, or be attenuated.

In addition to amplitude control 301 and frequency control 302, a triplet of controls are also present, which allow adjustment of the properties of a low- to mid-frequency parametric equalizer in channel strip 202A, which equalizer has characteristics well known to those skilled in the art. In a similar way to the low-frequency shelving filter equalizer controls, there is an amplitude control 303, and a frequency control 304.

As these controls adjust the characteristics of a parametric equalizer, frequency control 304, adjusting the corner frequency of the parametric equalizer, determines the centre frequency of the frequency range over which equalization will be applied. A quality factor control 305 is also present to control the Q-factor of the equalization curve, that is to say the bandwidth of the frequency range over which equalization will be applied.

Similar controls are present in each of the channels strips on mixing console 201, in addition to which there are controls that operate in a similar way for effecting modification of higher frequency sound being processed by each channel strip.

In the present embodiment, each of the controls in the mixing console for effecting changes in the gain of a pre-amplifier stage, dynamics and equalization are configured as wired remote controls, possibly using variable resistors or variable potentiometers to allow the provision of a signal indicative of their selected positions. In this configuration, each adjustment device reports its position, corresponding to a desired setting to a digital controller in the mixing console. The digital controller is then responsible for effecting the adoption of corresponding settings in the channel strip's components. This also allows control of the mixing console from a remote station, having means to effect adjustments of variables in the mixing console.

FIG. 4

Figure 4:
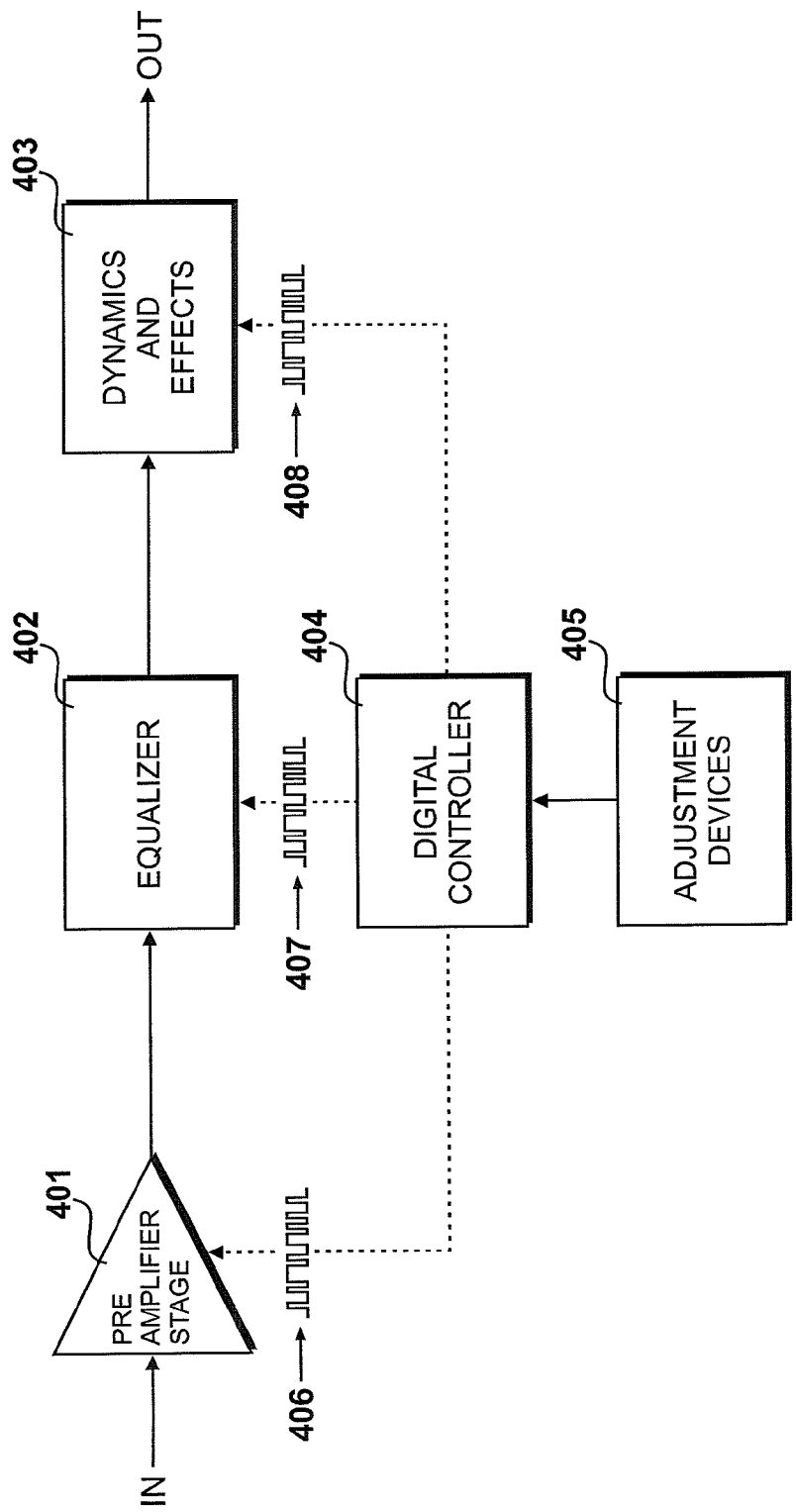
FIG. 4 shows a simplified block diagram of the components within a channel strip in the mixing console.

A simplified block diagram of the components within a channel strip in mixing console 201 (channel strip 202A in this Figure) is therefore illustrated in FIG. 4.

Input audio signals are received through a channel input, such as an audio signal from microphone 204 through input 203A. These are then supplied to a pre-amplifier stage 401, which applies a degree of amplification to the signal, typically in the order of 100 decibels. The amplified signal is then supplied to an equalizer stage 402 for applying equalization to the audio signal. Equalizer stage 402 may in some embodiment simply comprise a single equalizer, or alternatively a chain of equalizers for effecting equalization across numerous frequency ranges. Equalized signals are then supplied to a dynamics and effects stage 403, whereupon compression may be applied to the audio signal. After this stage, processed signals are then routed to their next destination, which, for instance, could be a master stage in the mixing console or an external device.

Each stage in the channel strip is coupled to and is under the control of a digital controller 404. In an embodiment, digital controller 404 is a microcontroller having stored, in internal memory, program control to effect adjustments to the characteristics of stages 401, 402 and 403 in response to adjustments made to adjustment devices on the mixing console, represented in the Figure as an adjustment devices block 405. As described previously, each adjustment device in block 405 uses some form of variable electronic element to produce a signal indicative of their position. Digital controller 404 samples these signals using an internal analog-to-digital converter (ADC) to arrive at a quantized value corresponding to the current position of an adjustment device.

Each stage 401, 402 and 403 comprises digital electronic elements that effect changes of parameter. Thus, in this embodiment, pre-amplifier stage 401 contains elements that allow digital control of the gain applied, equalizer stage 402 contains elements that allow digital control of equalization parameters, and dynamics and effects stage 403 contains elements that allow digital control of compression parameters, for example. In the present embodiment, equalizer stage 402, which is the subject of an aspect of the present invention, contains a number of multiplying digital-to-analog converters (MDACs) that provide variable levels of attenuation to be realized following the provision of digital codes provided by digital controller 404.

Thus, when adjustments are made to the appropriate adjustment devices on mixing console 201, such as those described previously with reference to FIG. 3, digital controller 404 supplies appropriate digital codes 406, 407 and 408 to appropriate elements in the correct stages in the channel strip. As will be described further with reference to FIG. 5, an equalizer in equalizer stage 402 can comprise two MDACs that are responsible for altering the corner frequency of the equalizer by changing their attenuation levels. Thus, in response to an adjustment, digital controller 404 supplies digital codes 406, 407 and 408 to the MDACs to effect control of their attenuation. The MDACs interpret the digital codes (possibly sets of bits), and establish themselves as attenuating elements in the circuit at a degree determined by the precise digital code provided.

FIG. 5

Figure 5:
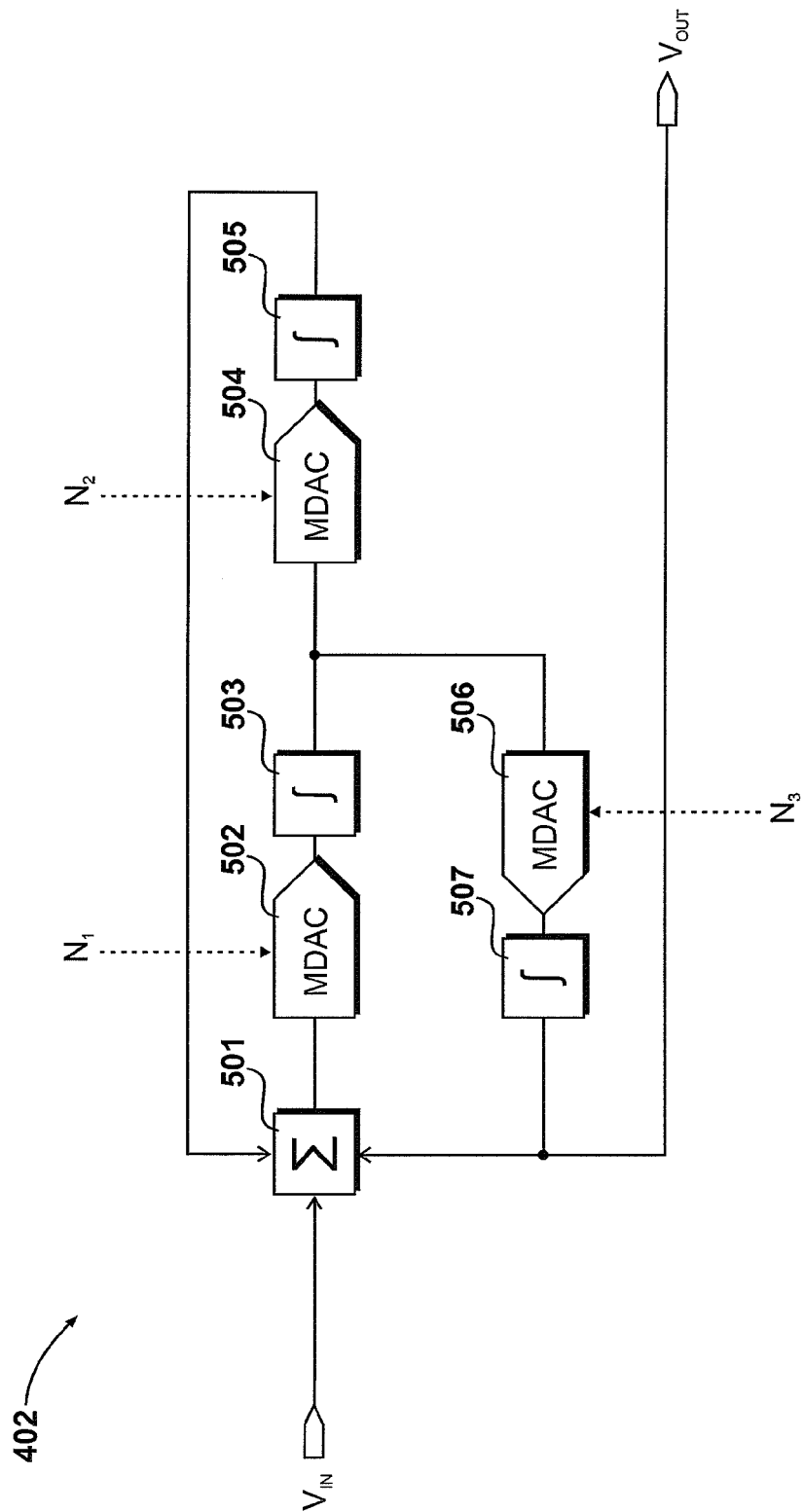
FIG. 5 shows a practical approach to providing an equalizer according to the present invention.

A practical approach to providing an equalizer to be used in equalizer stage 402 is illustrated in FIG. 5.

It will be recognized by those skilled in the art that the circuit topology illustrated in the Figure is a two-integrator loop state variable filter. State variable filters realize the state-space model of a linear time invariant system directly, by using a number of integrators with a feedback configuration.

An input signal $V_{IN}$ is received from pre-amplifier stage 401 having undergone a degree of amplification. This signal is supplied to a summing circuit 501, the output of which is supplied, via a first MDAC 502, to a first integrator 503. The output of first integrator 503 is then supplied, via a second MDAC 504, to a second integrator 505. The output of integrator 505 is fed back to summing circuit 501. In addition, the output of integrator 503 is also fed back to summing circuit 501, and also serves to provide bandpass output $V_{OUT}$. Thus, in this embodiment, the equalizer circuit shown in the Figure forms part of a parametric equalizer by providing a bandpass signal. As will be appreciated by those skilled in the art, however, low-pass output can be achieved by sampling the output of second integrator 505, whilst high-pass output can be achieved by sampling the output of summing circuit 501. In combination, first MDAC 502 and second MDAC 504 serve to provide control of the corner frequency of the equalizer. Changes to their attenuation realize corresponding changes to the corner frequency.

In certain embodiments of the present invention, there is also provided a third MDAC 506 in combination with a third integrator 507 in the feedback path from first integrator 503, just prior to the junction at which the bandpass output is sampled. This provides for damping of the circuit, and avoids the output having an infinite quality factor. Indeed, the provision of third MDAC 506 in combination with third integrator 507 allows control of the quality factor of the equalized output signal, by adjusting the attenuation of third MDAC 506. This control of the quality factor is independent from the adjustment of the corner frequency.

As will be appreciated by those skilled in the art, MDACs are digitally-controlled, ground-referenced variable attenuation elements that provide a plurality of discrete attenuation steps. In the present embodiment, the precision of the MDACs used in the equalizer is 14-bit, which is to say they offer 16384 possible attenuation levels. Alternative parts could be used, offering, say, 12- or 16-bit precision. The attenuation of the MDACs is adjusted by providing them with a digital code, which as described previously can be a stream of bits corresponding to a number between 0 and, for an n-bit MDAC, $2^n-1$. So, if one were to wish to attenuate a signal passing through a 14-bit MDAC to half its original value, then a digital code should be provided corresponding to a value of 8191.

In the Figure, digital code inputs are illustrated being supplied to each MDAC, which digital codes are provided by digital controller 404. Thus, a digital code $N_1$ is supplied to first MDAC 502, a digital code $N_2$ is supplied to second MDAC 504, and a digital code $N_3$ is supplied to third MDAC 506.

Through research conducted by the present applicant, it has been observed that adjustment of first MDAC 502 and second MDAC 504 independently results in non-linear effects. One may, on inspection, assume that a single step increase in the attenuation of first MDAC 502 would give an equivalent corner frequency shift to a single step increase in the attenuation of second MDAC 504, giving, from n-bit MDACS, (n+1)-bit possible steps in corner frequency. In fact, more sophisticated control in the programming of the MDACs by digital controller 404 reveals that a single step increase in the attenuation of second MDAC 504 gives twice as large a step in the corner frequency than a single step increase in the attenuation of first MDAC 502. Thus, when 14-bit MDACs are used in an equalizer employing the state variable topology illustrated in the Figure, 16384×3=49152 discrete steps become available in the adjustment of the corner frequency. This equates to [log(49152)−log(2)]-bit resolution, which is approximately 15.58-bit resolution. In the present invention, digital controller 404 includes program control so as to effect adjustments to the MDACs' attenuation levels in view of this more sophisticated approach to corner frequency control.

FIG. 6

Figure 6:
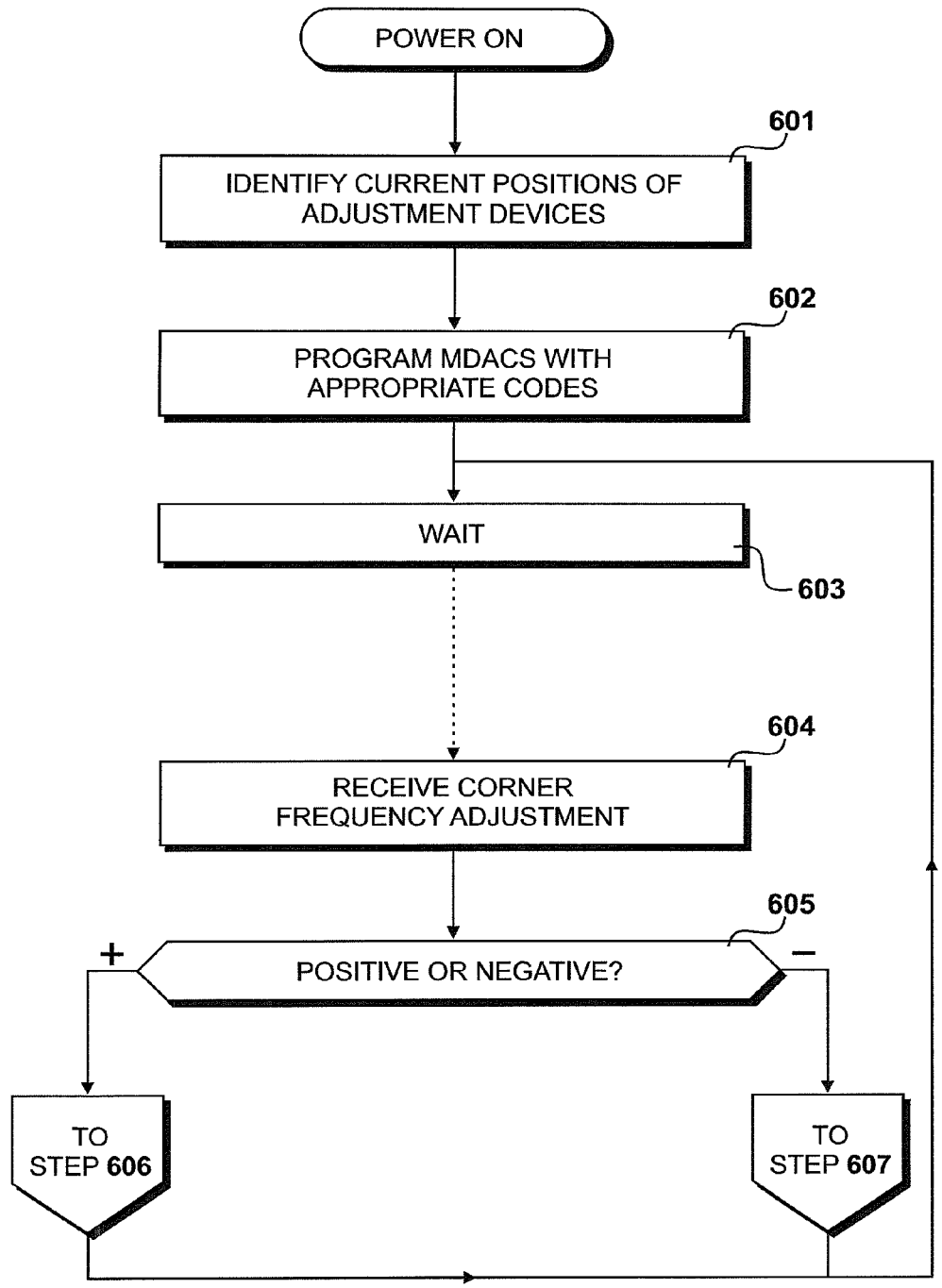
FIG. 6 shows procedures followed by a digital controller controlling the equalizer.

An overview of procedures carried out by digital controller 404 to control equalizer stage 402, is shown in FIG. 6.

Following powering on of mixing console 201, the current positions of the adjustment devices on the mixing consoles is identified at step 601. Appropriate digital codes $N_1$ and $N_2$ are then supplied to first MDAC 502 and second MDAC 504 at step 602. This step will, in the embodiment where MDAC control of quality factor is provided by the combination of third MDAC 506 and third integrator 507, also include supply of an appropriate digital code $N_3$ being supplied to the third MDAC. The digital control then waits at step 603 until an interrupt triggers the entry of step 604, where a corner frequency adjustment is received from the corresponding adjustment device, say adjustment device 304, for instance. A question is then asked at step 605 as to whether this adjustment is a positive or negative adjustment. Control proceeds to step 606 (detailed in FIG. 7) if the adjustment is positive, and to step 607 (detailed in FIG. 8) if negative. After the appropriate adjustment has been made, control returns to step 603 where the digital controller waits for an interrupt signifying another adjustment.

It is important to note that the interrupt that caused the entry of step 604 will occur for every step change in the modification made by an operator to the corresponding adjustment device. This ensures smooth changes to the corner frequency, rather than sudden jumps which could cause artefacts and distortion in the output audio.

FIG. 7

Figure 7:
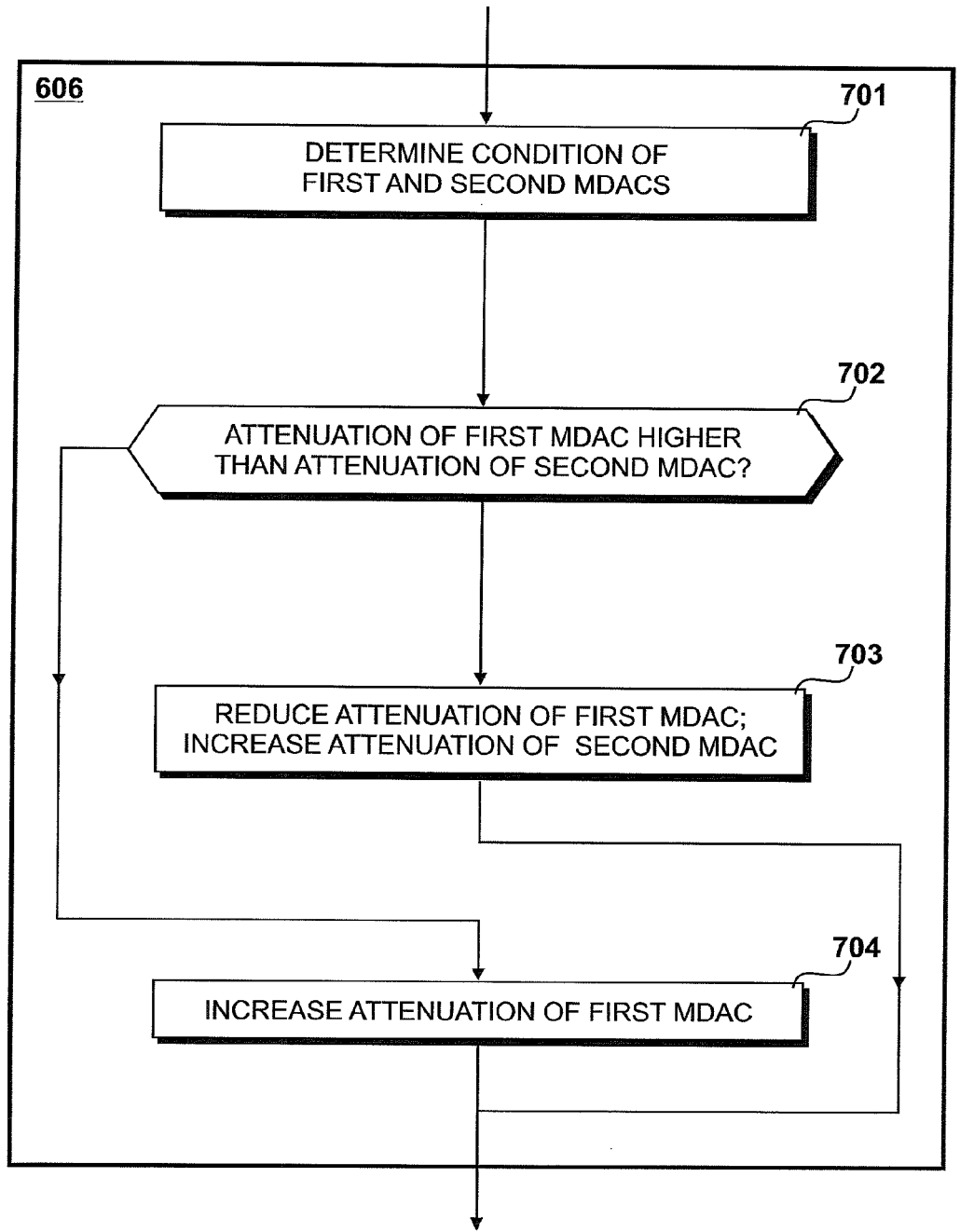
FIG. 7 shows procedures carried out to effect an increase in corner frequency.

Step 606, during which a step increase in the corner frequency of the equalizer is made, is detailed in FIG. 7.

At step 701, the condition of first MDAC 502 and second MDAC 504 is identified. A question is then asked at step 702 as to whether the attenuation of first MDAC 502 is higher than the attenuation of second MDAC 504. If answered in the affirmative, then at step 703 a digital code is supplied to first MDAC 502 to effect a step reduction in its attenuation, whilst a digital code is supplied to second MDAC 504 to effect a step increase in its attenuation.

If the question asked at step 702 is answered in the negative, indicating that the attenuation of first MDAC 502 is one step lower than or is equal to the attenuation of second MDAC 504, then control proceeds to step 704 where a digital code is supplied to first MDAC 502 to effect a step increase in its attenuation, whilst the attenuation of second MDAC 504 is left unchanged.

Thus, it can be seen that when the attenuation of the MDACs is equal, a one-step increase in corner frequency is achieved by incrementing the attenuation of first MDAC 502 by one step, and leaving the attenuation of second MDAC 504 unchanged. Furthermore, a two-step increase in corner frequency is achieved by leaving the attenuation of first MDAC 502 unchanged, and incrementing the attenuation of second MDAC 504 by one step. A three-step increase in corner frequency is achieved by incrementing the attenuation of first MDAC 502 by one step, and incrementing the attenuation of second MDAC 504 by one step.

FIG. 8

Figure 8:
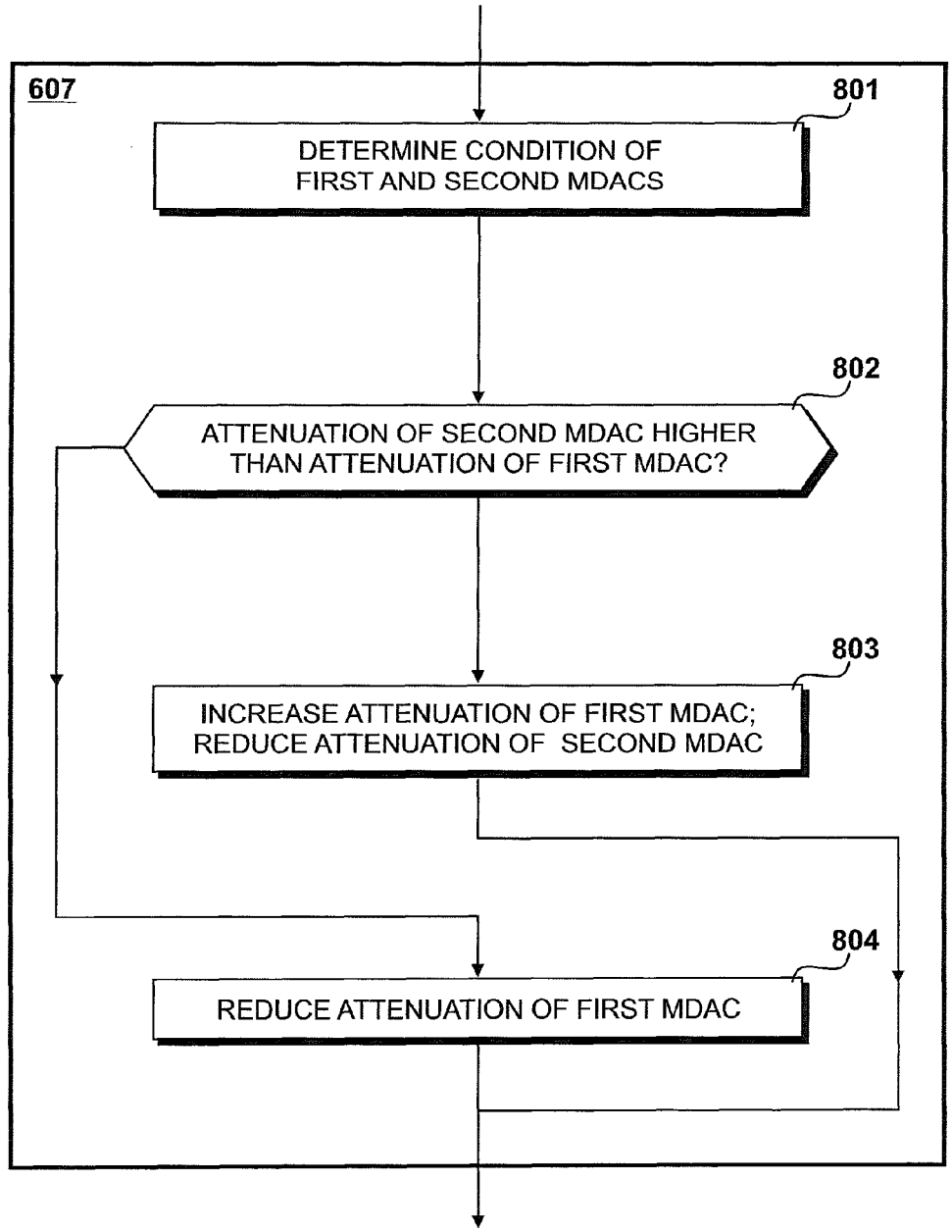
FIG. 8 shows procedures carried out to effect a decrease in corner frequency.

Step 607, during which a step decrease in the corner frequency of the equalizer is made, is detailed in FIG. 8.

At step 801, the condition of first MDAC 502 and second MDAC 504 is identified. A question is then asked at step 802 as to whether the attenuation of second MDAC 504 is higher than the attenuation of first MDAC 502. If answered in the affirmative, then at step 803 a digital code is supplied to first MDAC 502 to effect a step increase in its attenuation, whilst a digital code is supplied to second MDAC 504 to effect a step reduction in its attenuation.

If the question asked at step 802 is answered in the negative, indicating that the attenuation of first MDAC 502 is one step higher than or is equal to the attenuation of second MDAC 504, then control proceeds to step 804 where a digital code is supplied to first MDAC 502 to effect a step reduction in its attenuation, whilst the attenuation of second MDAC 504 is left unchanged.

Thus, it can be seen that when the attenuation of the MDACs is equal, a one-step decrease in corner frequency is achieved by reducing the attenuation of first MDAC 502 by one step, and leaving the attenuation of second MDAC 504 unchanged. In addition, a two-step decrease in corner frequency is achieved by leaving the attenuation of first MDAC 502 unchanged, and decreasing the attenuation of second MDAC 504 by one step. A three-step decrease in corner frequency is achieved by decreasing the attenuation of first MDAC 502 by one step, and decreasing the attenuation of second MDAC 504 by one step.

What I claim is:

1. An equalizer for applying equalization to an input audio signal, said equalizer including:
    a state variable filter having a first integrator and a second integrator, and having a variable corner frequency that is controlled by a first multiplying digital-to-analog converter (MDAC) coupled to said first integrator and a second multiplying digital-to-analog converter (MDAC) coupled to said second integrator, wherein said first multiplying digital-to-analog converter (MDAC) and said second multiplying digital-to-analog converter (MDAC) are each configured to provide variable attenuation in a plurality of discrete steps;
    a digital attenuation controller coupled to and configured to adjust the attenuation of said first multiplying digital-to-analog converter (MDAC) and said second multiplying digital-to-analog converter (MDAC) independently, and wherein, to effect a one-step increase in the corner frequency of the state variable filter, said digital attenuation controller is configured to determine attenuation levels of said first multiplying digital-to-analog converter (MDAC) and said second multiplying digital-to-analog converter (MDAC), and:
    in response to determining that the attenuation of said first multiplying digital-to-analog converter (MDAC) is equal to the attenuation of said second multiplying digital-to-analog converter (MDAC), increase the attenuation of said first multiplying digital-to-analog converter (MDAC) by one step and leaving the attenuation of said second multiplying digital-to-analog converter (MDAC) unchanged,
    in response to determining that the attenuation of said first multiplying digital-to-analog converter (MDAC) is one step higher than the attenuation of said second multiplying digital-to-analog converter (MDAC), decrease the attenuation of said first multiplying digital-to-analog converter (MDAC) by one step and increasing the attenuation of said second multiplying digital-to-analog converter (MDAC) by one step,
    in response to determining that the attenuation of said second multiplying digital-to-analog converter (MDAC) is one step higher than the attenuation of said first multiplying digital-to-analog converter (MDAC), increase the attenuation of said first multiplying digital-to-analog converter (MDAC) by one step and leaving the attenuation of said second multiplying digital-to-analog converter (MDAC) unchanged.

2. The equalizer of claim 1, wherein:
    said state variable filter further comprises a third multiplying digital-to-analog converter (MDAC) coupled to a third integrator, said third multiplying digital-to-analog converter (MDAC) being configured to provide variable attenuation in a plurality of discrete steps, and wherein the combination of said third multiplying digital-to-analog converter (MDAC) and said third integrator allows adjustment of the quality factor of said state variable filter; and said digital attenuation controller is further coupled to said third multiplying digital-to-analog converter (MDAC), so as to provide for adjustment of said quality factor of said state variable filter.

3. The equalizer of claim 1, forming part of a parametric equalizer circuit, wherein the output of said state variable filter is a bandpass signal.

4. A mixing console having a channel strip for modifying an input audio signal, said channel strip including an equalizer for applying equalization to an input audio signal, said equalizer including:

a state variable filter having a first integrator and a second integrator, and having a variable corner frequency that is controlled by a first multiplying digital-to-analog converter (MDAC) coupled to said first integrator and a second multiplying digital-to-analog converter (MDAC) coupled to said second integrator, wherein said first multiplying digital-to-analog converter (MDAC) and said second multiplying digital-to-analog converter (MDAC) are each configured to provide variable attenuation in a plurality of discrete steps;

a digital attenuation controller coupled to and configured to adjust the attenuation of said first multiplying digital-to-analog converter (MDAC) and said second multiplying digital-to-analog converter (MDAC) independently, and wherein, to effect a one-step increase in the corner frequency of the state variable filter, said digital attenuation controller is configured to determine the attenuation levels of said first multiplying digital-to-analog converter (MDAC) and said second multiplying digital-to-analog converter (MDAC), and:

in response to determining that the attenuation of said first multiplying digital-to-analog converter (MDAC) is equal to the attenuation of said second multiplying digital-to-analog converter (MDAC), increase the attenuation of said first multiplying digital-to-analog converter (MDAC) by one step and leaving the attenuation of said second multiplying digital-to-analog converter (MDAC) unchanged, in response to determining that the attenuation of said first multiplying digital-to-analog converter (MDAC) is one step higher than the attenuation of said second multiplying digital-to-analog converter (MDAC), decrease the attenuation of said first multiplying digital-to-analog converter (MDAC) by one step and increasing the attenuation of said second multiplying digital-to-analog converter (MDAC) by one step, in response to determining that the attenuation of said second multiplying digital-to-analog converter (MDAC) is one step higher than the attenuation of said first multiplying digital-to-analog converter (MDAC), increase the attenuation of said first multiplying digital-to-analog converter (MDAC) by one step and leaving the attenuation of said second multiplying digital-to-analog converter (MDAC) unchanged.

5. The mixing console of claim 4, further comprising a corner frequency adjustment device coupled to the digital attenuation controller, said corner frequency adjustment device being configured to allow manual adjustment of the corner frequency of the state variable filter.

6. The mixing console of claim 4,
wherein:
said state variable filter further comprises a third multiplying digital-to-analog converter (MDAC) coupled to a third integrator, said third multiplying digital-to-analog converter (MDAC) being configured to provide variable attenuation in a plurality of discrete steps, and wherein the combination of said third multiplying digital-to-analog converter (MDAC) and said third integrator allows adjustment of the quality factor of said state variable filter; and said digital attenuation controller is further coupled to said third multiplying digital-to-analog converter (MDAC), so as to provide for adjustment of said quality factor of said state variable filter; and further comprising a quality factor adjustment device coupled to the digital attenuation controller, said quality factor adjustment device being configured to allow manual adjustment of the quality factor of the state variable filter.

7. In an equalizer including a state variable filter having a first integrator and a second integrator, thus providing said equalizer with a corner frequency variable over a plurality of discrete steps, which is controlled by a first multiplying digital-to-analog converter (MDAC) coupled to said first integrator and a second multiplying digital-to-analog converter (MDAC) coupled to said second integrator, and wherein said first multiplying digital-to-analog converter (MDAC) and said second multiplying digital-to-analog converter (MDAC) are each configured to provide variable attenuation levels in a plurality of discrete steps, a method of adjusting the corner frequency of said equalizer, which method comprises steps of:

receiving an instruction to increment the corner frequency of the state variable filter by one step;

identifying the current corner frequency of the state variable filter, by determining the attenuation levels of said first multiplying digital-to-analog converter (MDAC) and said second multiplying digital-to-analog converter (MDAC); and in response to determining that the attenuation of said first multiplying digital-to-analog converter (MDAC) is equal to the attenuation of said second multiplying digital-to-analog converter (MDAC), increasing the attenuation of said first multiplying digital-to-analog converter (MDAC) by one step and leaving the attenuation of said second multiplying digital-to-analog converter (MDAC) unchanged, in response to determining that the attenuation of said first multiplying digital-to-analog converter (MDAC) is one step higher than the attenuation of said second multiplying digital-to-analog converter (MDAC), decreasing the attenuation of said first multiplying digital-to-analog converter (MDAC) by one step and increasing the attenuation of said second multiplying digital-to-analog converter (MDAC) by one step, in response to determining that the attenuation of said second multiplying digital-to-analog converter (MDAC) is one step higher than the attenuation of said first multiplying digital-to-analog converter (MDAC), increasing the attenuation of said first multiplying digital-to-analog converter (MDAC) by one step and leaving the attenuation of said second multiplying digital-to-analog converter (MDAC) unchanged.

8. The method of claim 7, wherein said state variable filter further comprises a third multiplying digital-to-analog converter (MDAC) coupled to a third integrator, said third multiplying digital-to-analog converter (MDAC) being configured to provide variable attenuation in a plurality of discrete steps, and wherein the combination of said third multiplying digital-to-analog converter (MDAC) and said third integrator allows adjustment of the quality factor of said state variable filter in a plurality of discrete steps, and wherein said method further comprises steps of:

receiving an instruction to increase the quality factor of said state variable filter;

increasing the attenuation of said third multiplying digital-to-analog converter (MDAC) by one step.

\* \* \* \* \*